Oct. 6, 1970 J. L. BOYER 3,532,942

PRESSURE-ASSEMBLED SEMICONDUCTOR DEVICE HOUSING HAVING THREE TERMINALS

Filed May 23, 1967 2 Sheets-Sheet 1

INVENTOR.
JOHN L. BOYER

BY

OSTROLENK, FABER, GERB & SOFFEN

ATTORNEYS

Oct. 6, 1970 J. L. BOYER 3,532,942

PRESSURE-ASSEMBLED SEMICONDUCTOR DEVICE HOUSING HAVING THREE TERMINALS

Filed May 23, 1967

2 Sheets-Sheet 2

United States Patent Office 3,532,942
Patented Oct. 6, 1970

3,532,942

PRESSURE-ASSEMBLED SEMICONDUCTOR DEVICE HOUSING HAVING THREE TERMINALS

John L. Boyer, El Segundo, Calif., assignor to International Rectifier Corporation, El Segundo, Calif., a corporation of California Filed May 23, 1967, Ser. No. 640,723
Int. Cl. H01l *1/14, 1/16*
U.S. Cl. 317—234 5 Claims

ABSTRACT OF THE DISCLOSURE

A pressure-assembled housing containing at least two semiconductor devices between a pair of massive terminal electrodes which are compressed toward one another to complete an electrical connection to the device. A third electrode, connected between two adjacent semiconductor devices, is provided and extends through a portion of the device housing.

This invention relates to pressure-assembled semiconductor devices, and more specifically relates to a novel pressure-assembled semiconductor assembly having two exposed electrodes for receiving a mounting and clamping structure, and a third electrode taken through the device insulation housing which is connected between two separate wafers contained within the housing.

This application is an improvement of the structure illustrated in my copending application, Ser. No. 640,629, filed May 23, 1967, entitled "Pressure-Assembled Semiconductor Device Having a Plurality of Semiconductor Wafers," and assigned to the assignee of the present invention, which illustrates a novel housing structure for at least two semiconductor devices which are contained within a common housing. In the above noted application, the two individual semiconductor devices are connected to one another through a common conductive plate intermediary.

In accordance with the present invention, this conductive plate body is provided with an extending portion which passes through the housing surrounding the devices, thereby forming a third terminal which permits the various semiconductor devices within the housing to be connected in configurations forming portions of complete circuits containing at least two separate semiconductor devices, such as diodes or controlled rectifiers.

Accordingly, it is a primary object of this invention to provide a novel third terminal semiconductor device assembly using compression bonding techniques.

Another object of this invention is to provide a novel pressure-assembled assembly containing two or more semiconductor devices with the assembly exposing two massive electrodes for compression bonding purposes, and for electrical connection, and a third exposed electrode which is common to two of the internally contained semiconductor devices.

These and other objects of this invention will become apparent from the following description when taken in connection with the drawings, in which.

Figure 1:
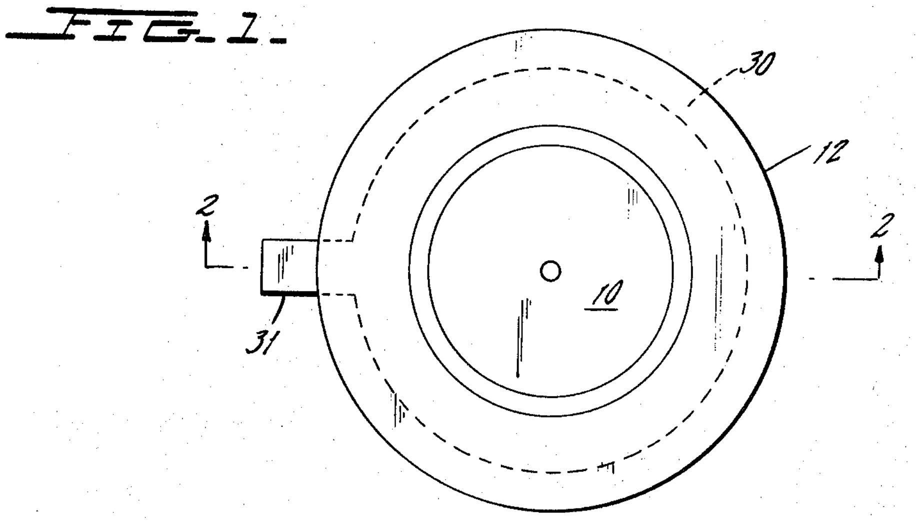
FIG. 1 is a top view of an assembly constructed in accordance with the invention.
Figure 2:
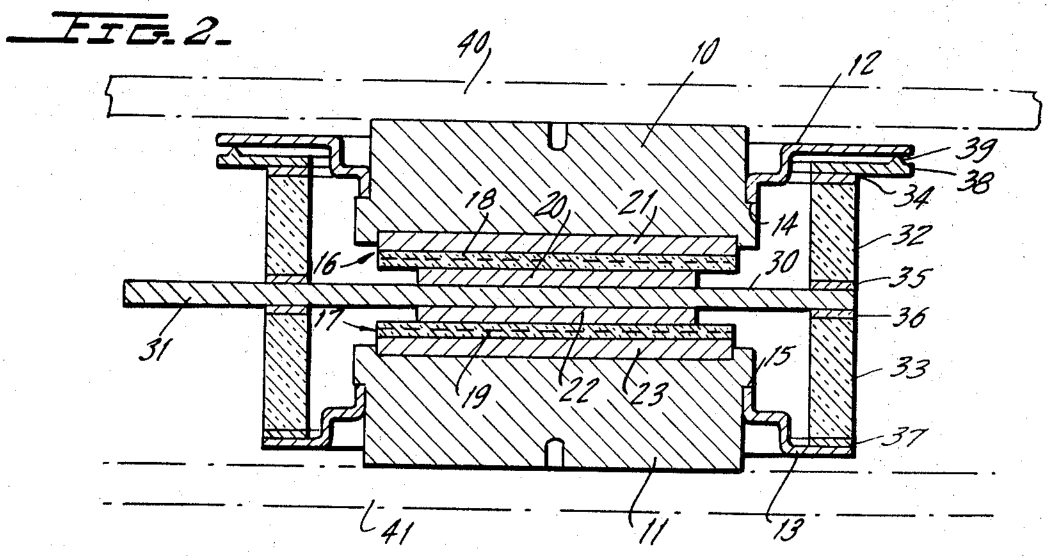
FIG. 2 is a cross-sectional view of FIG. 1 taken across the section lines 2—2 in FIG. 1.

Referring first to FIGS. 1 and 2, there is illustrated therein a pressure-assembled device having two massive electrodes 10 and 11 which are, respectively, supported by thin, flexible conductive diaphragms 12 and 13. Each of diaphragms 12 and 13 are connected to the electrodes 10 and 11 at their interior peripheries and within the shoulders 14 and 15, respectively.

Each of devices 10 and 11 then receive semiconductor device assemblies 16 and 17, respectively, which are composed of semiconductor wafers 18 and 19, respectively, having expansion plates 20–21 and 22–23. The various expansion plates are secured to their wafers in the usual manner, as by soldering, or the like. Each of wafers 18 and 19 contain junctions therein which define diodes for each of the devices. The forward conduction direction of these diodes may be varied, as will be later described in FIGS. 3 to 5, depending upon the purpose of the ultimate assembly.

The expansion plates 20 and 22 each sit on the opposite sides of a central metallic disk 30, having an extending tongue region 31. The various elements are supported and are hermetically sealed by the two ceramic insulation rings 32 and 33 which each have metallized end surfaces 34–35 and 36–37, respectively. Metallized surface 37 is connected to diaphragm 13 while metallized surfaces 35 and 36 are connected to disk 30, as shown. Metallized region 34 is connected to a welding ring 38, which has a welding projection 39, which is resistance-welded to the outer periphery of diaphragm 12.

In assembling the device, the wafer assembly 17 is first located in the depressed well in electrode 11. Thereafter, ring 33 is secured to diaphragm 13 and ring 30 is secured atop metallized coating 36. Preferably, plate 30 should be sufficiently thin so that it can be deflected slightly to insure good electrical connection between the lower surface of plate 30 and the upper expansion plate 32. By way of example, ring 30 may have a thickness of about 1/16 of an inch. Ring 32 is then secured atop disk 30 and the wafer subassembly 16 is located within electrode 10 and the electrode 10 is placed atop disk 30. The welding ring 38, which extends beyond the periphery of insulation ring 32, is then resistance-welded to the outer periphery of diaphragm 12 in order to secure the assembly together. The entire device is then subsequently mounted by some suitable compression mounting structure, which would include clamping bolts (not shown) which are insulated. The device would, for example, be mounted by clamping it to connection buses, shown in dotted lines as buses 40 and 41.

The novel device of FIG. 2 can now be used in a plurality of circuit configurations. For example, where the junctions of wafers 18 and 19 have the same forward conduction direction, the device can simply be used as a high-voltage diode by virtue of the series-connection of two separate elements.

Figure 3:
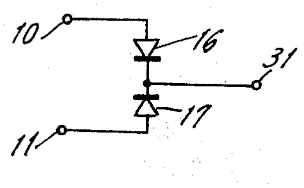
FIGS. 3, 4 and 5 illustrate various circuit configurations which can be taken by the devices of FIG. 2.
Figure 4:
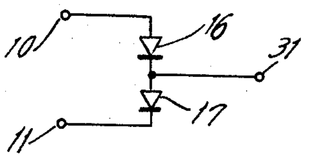
Figure 5:
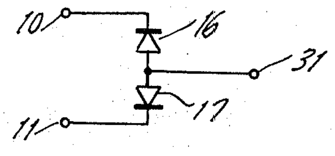

Alternatively, and as shown in FIG. 4, the device could also offer a centertap-connection between two series-connected diodes, thereby serving as ½ of a single-phase fullwave bridge, with the diodes 16 and 17 connected in series with the A-C terminals 10 and 11, with one of the output terminals comprising the terminal 31. Alternatively, if both of assemblies 16 and 17 are of identical construction so that their forward conduction directions are oppositely directed, they would define the circuit illustrated in FIG. 3, which again could be ½ of a single phase ½-wave bridge, with the terminals 10 and 11 forming the output terminals, and the terminal 31 forming one of the load terminals.

The device of FIG. 2, when arranged to satisfy the circuit of FIG. 3, would use N-P junctions in wafers 18 and 19. Where these junctions, however, are reversed junctions, the circuit would then be that shown in FIG. 5 forming, for example, one leg of a full-wave three-phase bridge with terminals 10 and 11 comprising the D-C output terminals, and terminal 31 comprising the A-C connection to one phase.

Figure 7:
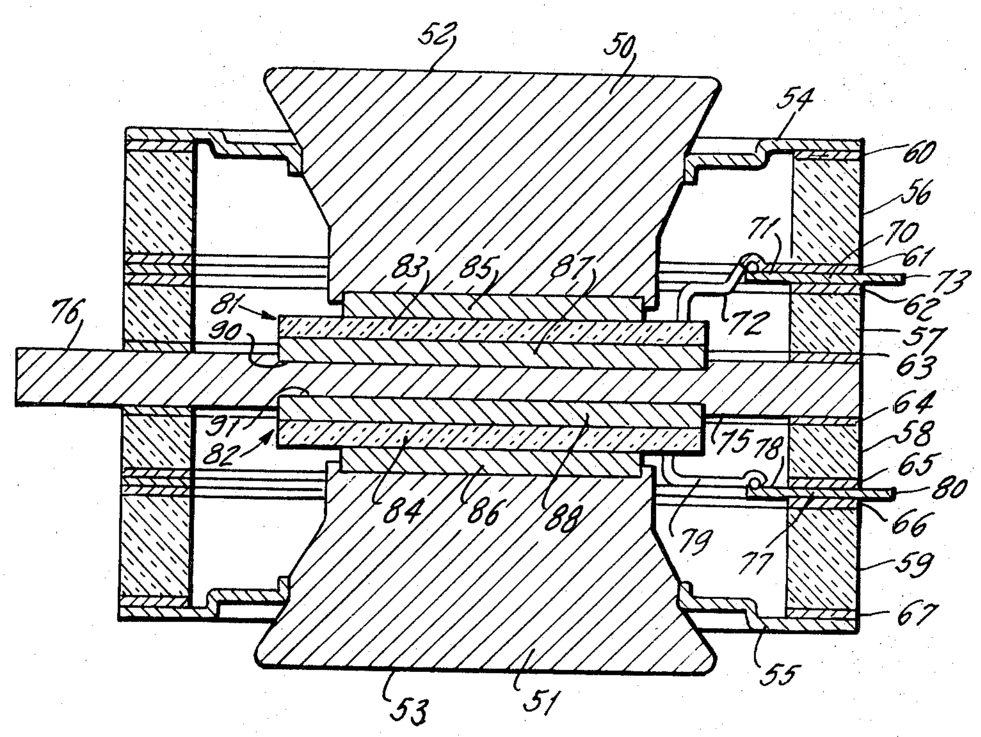
FIG. 7 is a cross-sectional view similar to FIG. 2, illustrating the mounting of controlled rectifiers.

FIG. 7 illustrates the manner in which the novel assembly can be constructed for the case of controlled rectifier devices. Thus, in FIG. 7 and in a manner analogous to that described in FIG. 2, two massive electrodes 50 and 51, having flat parallel surfaces 52 and 53, which are to be connected in some suitable compressional support structure, are each provided with flexible diaphragms 54 and 55. A stack of insulation rings 56, 57, 58 and 59 are provided, each having metallized ends 60–61, 62–63, 64–65 and 66–67, and stacked in the manner shown with coating 67 connected to diaphragm 55, and coating 60 connected to diaphragm 54. Note that the upper connection between coating 60 and diaphragm 54 could be modified in the manner illustrated in FIG. 2 to incorporate an enlarged peripheral welding ring for increased flexibility.

Coatings 61 and 62 are secured on the opposite sides of gate connection ring 70 which has an internally extending tongue 71 for connection to gate lead 72, and an external connection-tap 73. Insulation coatings 63 and 64 are then connected to conductive ring 75, which is similar to conductive ring 30 of FIG. 2, and has an extending connection tab 76. Coating 65 and 66 are connected to a gate connection ring 77, which has an internal tongue 78 for connection to gate lead 79, and an external tongue 80 for external connections.

The interior of the device of FIG. 7 contains two controlled rectifier subassemblies 81 and 82 which are composed of suitable semiconductor wafers 83 and 84, respectively, having cathode expansion plates 85 and 86, respectively, and anode expansion plates 87 and 88, respectively. Previously described gate leads 72 and 79 extend from the gate regions of the wafers 83 and 84, respectively. It is to be noted that the conductive ring 75, in the case of FIG. 7, has two depressed wells 90 and 91 which serve to lock the subassemblies 81 and 82 with respect to ring 75.

With the device of FIG. 7 assembled as shown, there are three major terminals which are exposed, two for each of the cathodes formed by terminals 50 and 51, and a common terminal 76, which is connected to the anodes of two devices. In addition, connection may be made to the gates of the two devices by extending tongues 73 and 80.

Figure 6:
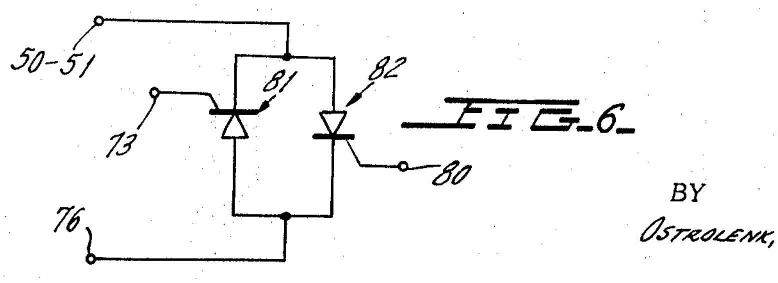
FIG. 6 illustrates a circuit configuration for use as an A-C switch where the devices contained within the assembly are controlled rectifiers.

The device of FIG. 7 can be used as an A-C switching device with the two subassemblies 81 and 82 connected in parallel with one another with opposing polarities where the two wafers 81 and 82 are, respectively, NPNP and PNPN devices. Thus, a circuit can be formed similar to that of FIG. 6 with the compression bonding structure connected to terminals 50 and 51 being connected to the same polarity and defining the terminals 50–51 shown in FIG. 6. The opposite terminal in FIG. 6 would be the terminal 76 of FIG. 7 whereupon a unitary structure can be used as an A-C switching device. Note that a variety of circuit configurations can be constructed from the three available major conducting terminals in FIG. 7 with various combinations of the layer orders in the semiconductor wafers 83 and 84.

Figure 8:
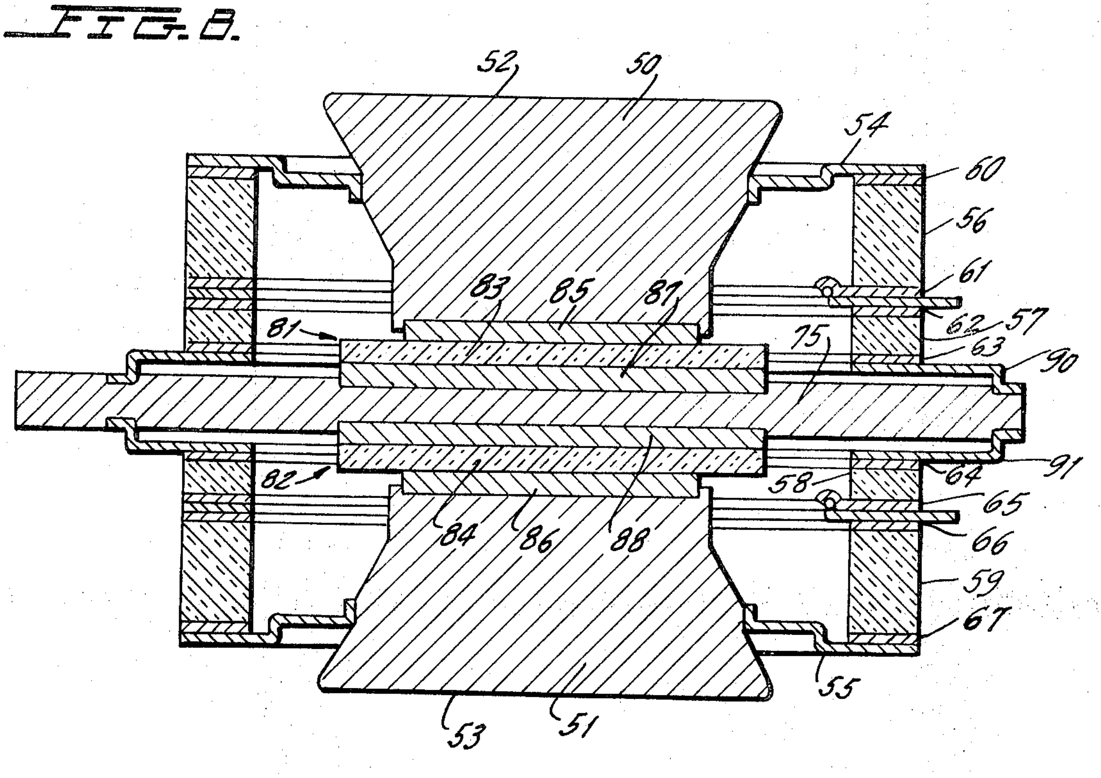
FIG. 8 illustrates a modification of the arrangement of FIG. 7 wherein each of the individual devices are flexibly mounted at either axial end.

FIG. 8 shows an arrangement generally similar to that FIGS. 2 and 7, with like numerals identifying similar components where, however, an additional degree of flexibility is imparted to the assembly by connecting the switches 57 and 58 to the central conductive ring 75 by additional flexible members. Thus, in FIG. 8, two central flexible diaphragms 90 and 91 are connected at their interiors to coatings 63 and 64, respectively, while the outer diameter of rings 90 and 91 are connected to the enlarged periphery of disk 75. Thus, two additional points of flexure are provided in the arrangement of FIG. 8 with all other aspects of the device being identical to that described in FIGS. 2 and 7. Note that this arrangement could be used for the case of single junction devices for the wafers 83 and 84.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A three-terminal pressure-assembled semiconductor device housing comprising first and second coaxial massive electrodes having respective flat outer end surfaces and opposing interior faces axially spaced from one another, first and second semiconductor wafers each having first and second expansion plates secured to their opposite surfaces, first and second flexible diaphragms having central openings, a cylindrical insulation ring and a conductive plate for serving as a third terminal electrode; said first and second flexible diaphragms comprising the sole flexible components of said device, said central openings of said first and second diaphragms respectively connected to the outer periphery of said first and second massive electrodes, respectively, with said flat outer end surfaces of said first and second massive electrodes extending beyond the plane of said first and second diaphragms, respectively; the outer periphery of said first and second diaphragms respectively connected to the opposite ends of said cylindrical insulator, thereby to define a sealed interior volume; said first and second wafers and said conductive plate contained within said interior volume; said first expansion plates of said first and second wafers engaging respective surfaces of said opposing interior surfaces of said first and second massive electrodes; said conductive plate having parallel opposing surfaces respectively directly engaging said second expansion plates of said first and second wafers; said conductive plate having a diameter approximately equal to the outer diameter of said cylindrical insulation ring and extending through generally axially central portions of said insulation ring; said conductive plate having a terminal connection member extending from the outer diameter thereof;

wherein said first expansion plates are each of larger diameter than said second expansion plates; said first wafer having an N-type conductivity region adjacent its said first expansion plate; said second wafer having a P-type conductivity region adjacent its said first expansion plate.

2. The device as set forth in claim 1 wherein at least one of said opposing surfaces of said conductive plate contains expansion plate positioning means extending therefrom.

3. The device as set forth in claim 2 wherein said second expansion plates face one another.

4. The device as set forth in claim 1 wherein said first and second wafers are four-layer devices and each have a gate lead extending therefrom; first and second conductive ring means extending through axial portions of said cylindrical insulation ring means in planes on respective opposite sides of said conductive plate; and connection means connecting said gate leads of said first and second wafers to said first and second conductive ring means.

5. The device as set forth in claim 1 wherein said cylindrical insulation ring is formed in two spaced insulation ring segments and third and fourth diaphragms have central openings therein and extending outer peripheries; said central openings of said third and fourth diaphragms respectively connected to the opposing ends of said insulation ring segments; said conductive plate extending beyond the outer peripheries of said cylindrical insulation ring; the outer peripheries of said third and fourth diaphragms connected to the outer periphery of said conductive plate means.

References Cited

UNITED STATES PATENTS

| | | | |
|---|---|---|---|
| 3,447,042 | 5/1969 | Andersson | 317—234 |
| 3,183,407 | 5/1965 | Yasuda et al. | 317—101 |
| 3,238,425 | 3/1966 | Geyer | 317—234 |
| 3,310,716 | 3/1967 | Emeis | 317—234 |
| 3,356,914 | 12/1967 | Whigham et al. | 317—234 |

FOREIGN PATENTS

| | | |
|---|---|---|
| 72,811 | 4/1960 | France. |
| 1,010,131 | 11/1965 | Great Britain. |
| 1,078,779 | 8/1967 | Great Britain. |
| 1,466,106 | 12/1966 | France. |

JOHN HUCKERT, Primary Examiner

R. F. POLISSACK, Assistant Examiner

U.S. Cl. X.R.

317—235